United States Patent
Bohr et al.

[11] Patent Number: 5,734,187
[45] Date of Patent: Mar. 31, 1998

[54] MEMORY CELL DESIGN WITH VERTICALLY STACKED CROSSOVERS

[75] Inventors: Mark T. Bohr, Aloha; Jeffrey K. Greason, Portland, both of Oreg.

[73] Assignee: Intel Corporation, Santa Clara, Calif.

[21] Appl. No.: 876,473

[22] Filed: Jun. 16, 1997

Related U.S. Application Data

[63] Continuation of Ser. No. 623,463, Mar. 28, 1996, abandoned.

[51] Int. Cl.$^6$ ................ H01L 29/76; H01L 29/94; H01L 31/062; H01L 31/113
[52] U.S. Cl. ................ 257/377; 257/368; 257/758; 257/776; 257/903; 257/904; 365/69; 365/154; 365/180; 365/185.07
[58] Field of Search ................ 257/368, 377, 257/903, 904, 758, 776; 365/69, 154, 180, 185.07

[56] References Cited

U.S. PATENT DOCUMENTS

| | | | |
|---|---|---|---|
| 5,404,030 | 4/1995 | Kim et al. | 257/67 |
| 5,436,506 | 7/1995 | Kim et al. | 257/347 |
| 5,452,247 | 9/1995 | Takao | 365/182 |
| 5,453,640 | 9/1995 | Kinoshita | 257/520 |
| 5,471,071 | 11/1995 | Yoshihara | 257/69 |
| 5,483,083 | 1/1996 | Meguro et al. | 257/69 |
| 5,485,420 | 1/1996 | Lage et al. | 365/154 |
| 5,486,717 | 1/1996 | Kokubo et al. | 257/385 |
| 5,489,790 | 2/1996 | Lage | 257/330 |
| 5,491,654 | 2/1996 | Azuma | 365/156 |
| 5,521,860 | 5/1996 | Ohkubo | 365/154 |
| 5,596,212 | 1/1997 | Kuriyama | 257/298 |
| 5,619,056 | 4/1997 | Kuriyama et al. | 257/369 |

FOREIGN PATENT DOCUMENTS 8-17944  1/1996  Japan .

*Primary Examiner*—Mahshid D. Saadat
*Assistant Examiner*—Allan R. Wilson
*Attorney, Agent, or Firm*—Cynthia Thomas Faatz

[57] ABSTRACT

A memory cell with vertically stacked crossovers. In prior memory cells, crossover connections within the memory cell were implemented in the same device layer. This wasted valuable design space, since the crossovers were therefore required to sit side-by-side in the layout design. The present invention implements crossovers in different materials on different device layers. The crossovers may therefore be vertically stacked on top of each other, reducing the area of the memory cell.

25 Claims, 8 Drawing Sheets

MEMORY CELL DESIGN WITH VERTICALLY STACKED CROSSOVERS

This is a continuation of application Ser. No. 08/623,463, filed Mar. 28, 1996, now abandoned.

FIELD OF THE INVENTION

The field of the invention relates to memory cell design. More specifically, the invention relates to a memory cell design with vertically stacked crossovers.

BACKGROUND OF THE INVENTION

Static random access memory (SRAM) is frequently used in integrated circuit devices. For instance, arrays of SRAM cells are employed as a cache memory for high-speed microprocessors. One such application of SRAM is in the Level 2 (L2) cache for the Pentium® Pro processor sold by Intel Corporation of Santa Clara, Calif.

An SRAM cell array typically consists of multiple, identical SRAM cells, one for each bit of the memory. For instance, millions of SRAM cells would be required to implement the 256K L2 cache for the Pentium® Pro processor. As the size of the array increases, valuable die space is wasted and manufacturing costs increase. It is desirable, therefore, to minimize the size of a single SRAM cell as much as possible such that the size of an SRAM array does not become too large, waste die space and become costly.

One example of an SRAM design is illustrated in FIG. 1. The 6-transistor SRAM cell 10 includes two complementary metal oxide semiconductor (CMOS) inverters. The first inverter consists of transistors 110 and 111. The second inverter consists of transistors 112 and 113. Two pass transistors 114 and 115 are used to select the SRAM cell for reading and writing operations.

To write to the cell 10, the appropriate write data (DATA) is placed on the bit line (BIT) and its complement (DATA#) is placed on the BIT# line. The wordline (WL) is then asserted on the gate of transistors 114 and 115, and DATA is written to the cell 10. To read the cell, BIT and BIT# are precharged. Thereafter the WL is asserted and either the BIT or BIT# line is discharged by transistors 112 or 111, respectively. As an alternative, static pullups (not shown) may be added to the BIT and BIT# lines to eliminate the need for precharge.

Alternative prior art SRAM cells are designed similar to cell 10, except that the PMOS transistors 110 and 113 are replaced by other well-known pullup devices, such as a depletion transistor, an enhancement transistor, or a resistor. Another prior art SRAM cell includes one transistor, rather than two, to control the BIT and WL signals. Moreover, a similar prior SRAM cell includes two ports, or word lines, to control data transfers to and from the cell.

These prior SRAM cell designs are similar in that all require the use of crossover connections, such as crossover connections 120 and 121 in memory cell 10. The crossover connection 120 couples the input of the first inverter that includes transistors 110 and 111 to the output of the second inverter that includes transistors 112 and 113. Moreover, crossover connection 121 couples the input of the second inverter that includes transistors 112 and 113 to the output of the first inverter that includes transistors 110 and 111.

Typical prior SRAM device-layer layouts implement both crossovers in the same material, using the same mask layer. Thus the layout of the SRAM cell might look like cell 20 of FIG. 2. The crossovers 220 and 221 of cell 20 are both implemented in a first metal layer of the layout. It is a disadvantage of this cell layout 20 that crossovers 220 and 221 must be disposed side by side to each other, increasing the size of the SRAM cell.

FIG. 3 shows another prior SRAM device-layer layout in which the two crossovers 320 and 321 are implemented in a gate layer, typically made of polysilicon. Once again, because crossovers 320 and 321 are both implemented on the same device layer, they must be placed side by side.

FIG. 4 illustrates a third prior device-layer layout of an SRAM cell 40 using a gate layer along with a local interconnect layer. Crossovers 420 and 421 are primarily implemented in the gate layer and the connection of the gate layer to the source or drain of the transistor is implemented by a local interconnect layers 420a–b and 421a–b. The local interconnect layer is different from a typical first or second level metal layer in that the local interconnect is deposited directly on top of exposed polysilicon and diffusion regions of a transistor device. Even with the use of a local interconnect layer, the crossovers 420 and 421 must be positioned side by side, increasing the amount of area required by the SRAM cell.

It can be appreciated from the above discussion of prior SRAM cell layouts that it is desirable to provide an SRAM cell layout wherein the size of the cell can be minimized.

Moreover, to decrease manufacturing costs, it is desirable to provide a minimum-sized SRAM cell that can be designed using existing process materials, parameters, and design rules. Thus the desired SRAM cell design would not require semiconductor processing variations to implement.

SUMMARY OF THE INVENTION

A semiconductor memory cell having vertically stacked crossovers is described. The memory cell comprises a first inverter having a first input and a first output, and a second inverter having a second input and a second output. The first and second inverters are coupled with a first and second crossover connection. The first crossover connection couples the first input to the second output. The second crossover connection couples the second input to the first output. The two crossover connections comprise different conductive layers in the semiconductor fabrication process. The two crossover connections are therefore vertically stacked on top of each other in order to reduce the area of the memory cell layout.

BRIEF DESCRIPTION OF THE DRAWINGS

The present invention is illustrated by way of example and not limitation in the accompanying figures in which.

DETAILED DESCRIPTION

A memory cell design with vertically stacked crossovers is described. In the following description, numerous specific details are set forth, such as specific materials, process parameters, and layout techniques, in order to provide a thorough understanding of the present invention. It will be apparent, however, to one skilled in the art that these specific details need not be employed to practice the present invention. In other instances, well known processing methods or materials have not been described in detail in order to avoid obscuring the present invention.

One embodiment of the memory cell of the present invention comprises a 6-transistor SRAM cell design with crossovers that are vertically stacked within the cell layout. In other words, a majority of one crossover connection is disposed on top of the other crossover connection within the SRAM cell layout.

Alternatively, the memory cell may comprise more or less than 6 transistors as a matter of design choice, and may comprise other well-known logic gates rather than inverters. Moreover, the memory cell may comprise a dynamic random access memory (DRAM) cell. It is merely essential that the memory cell employ crossovers, and that the crossovers vertically overlap each other to some extent.

Figure 1:
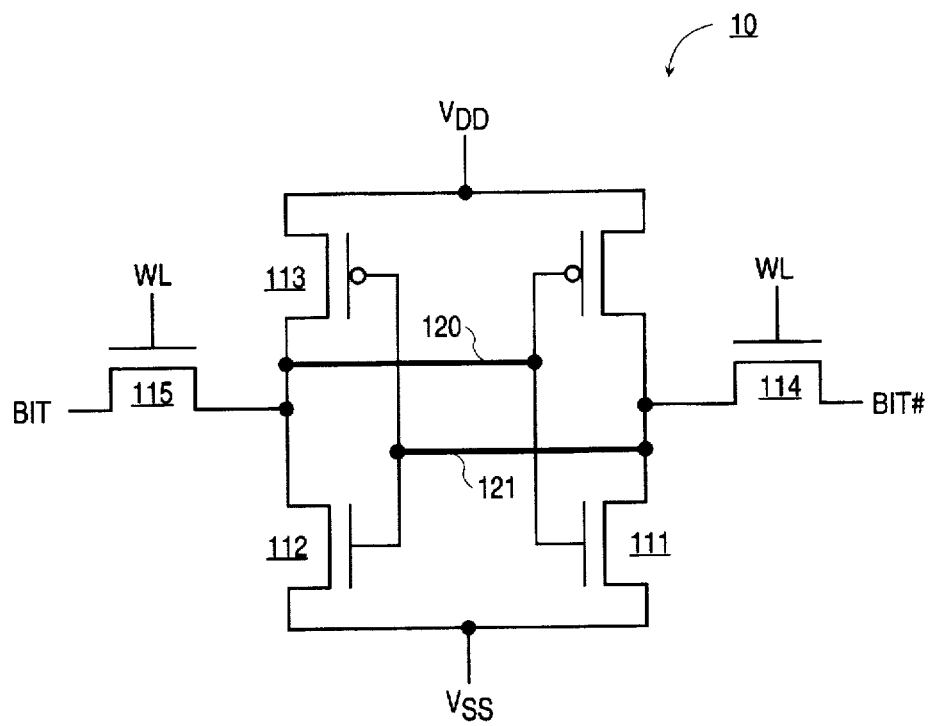
FIG. 1 illustrates a prior art six-transistor SRAM cell.
Figure 2:
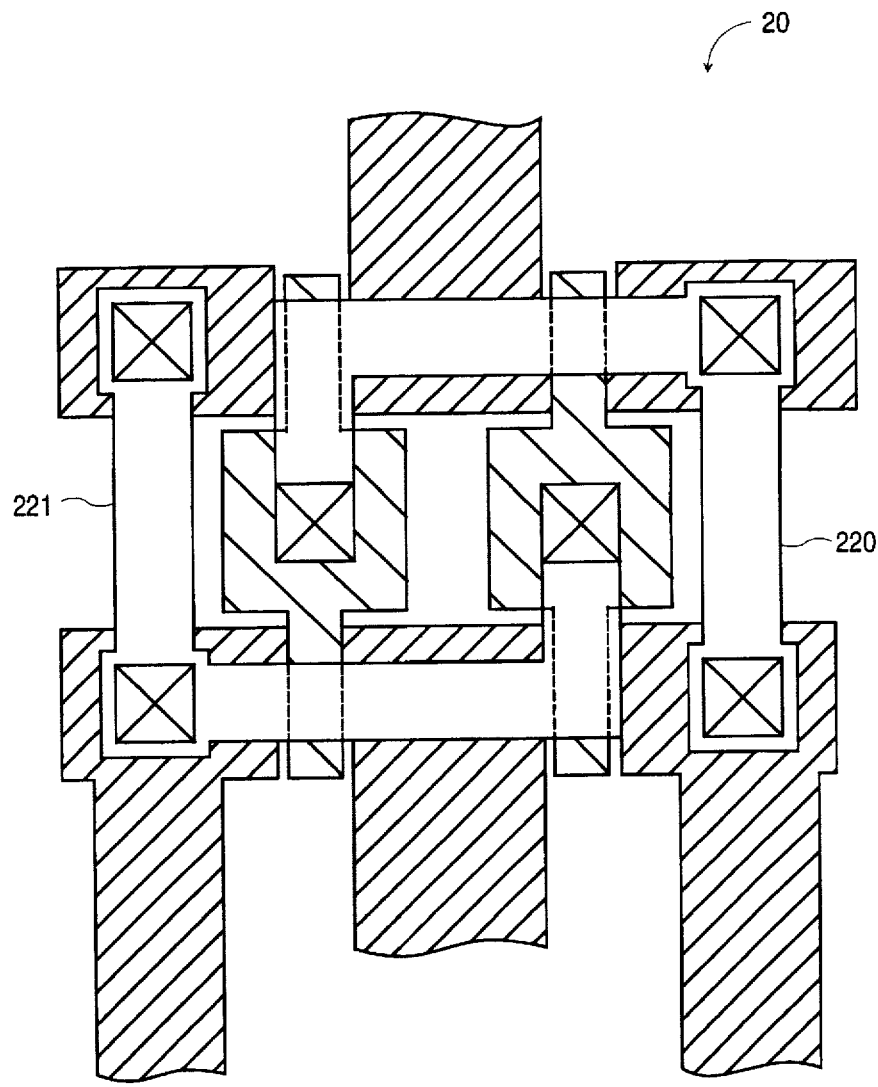
FIG. 2 illustrates a prior art layout of an SRAM cell with metal crossovers.
Figure 3:
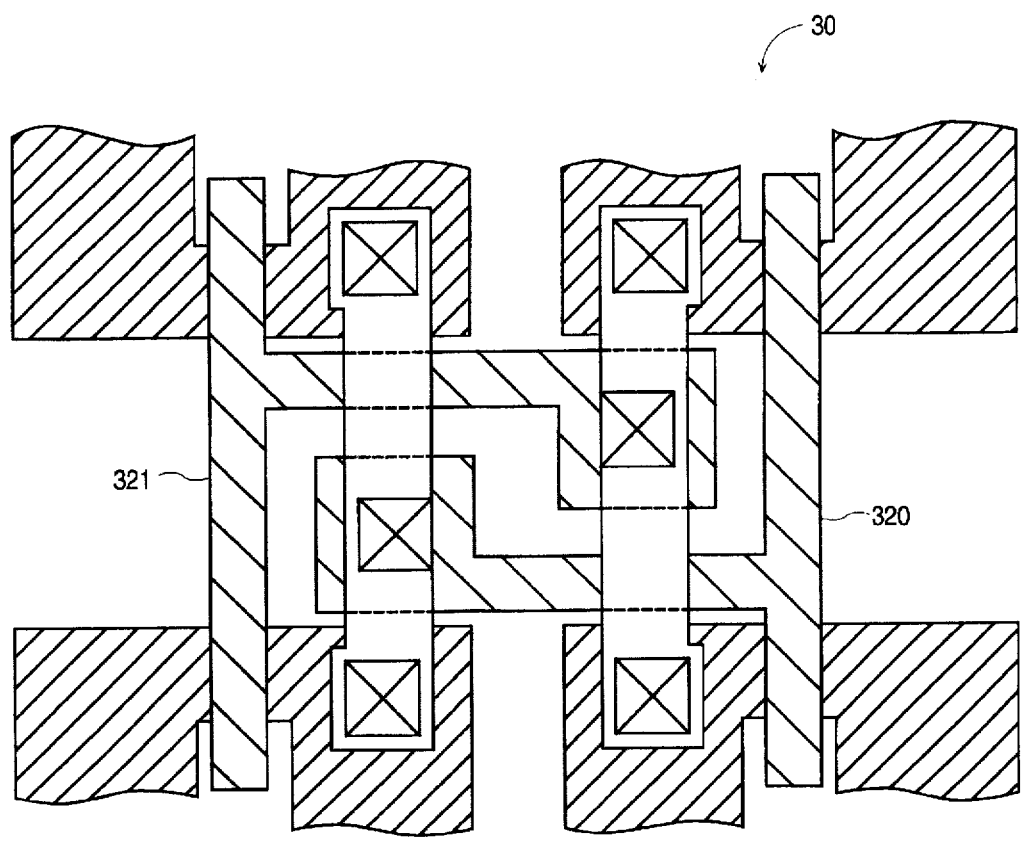
FIG. 3 illustrates a prior art layout of an SRAM cell with gate-level interconnect crossovers.
Figure 4:
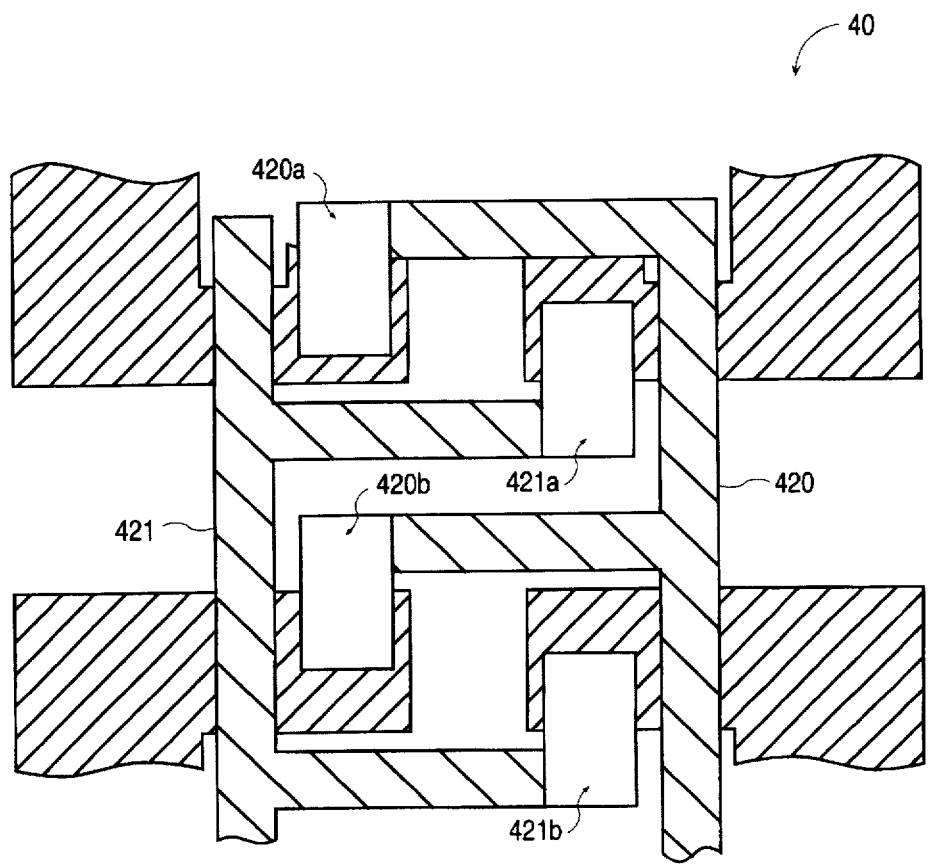
FIG. 4 illustrates a prior art layout of an SRAM cell with gate-level interconnect and local interconnect crossovers.
Figure 5:
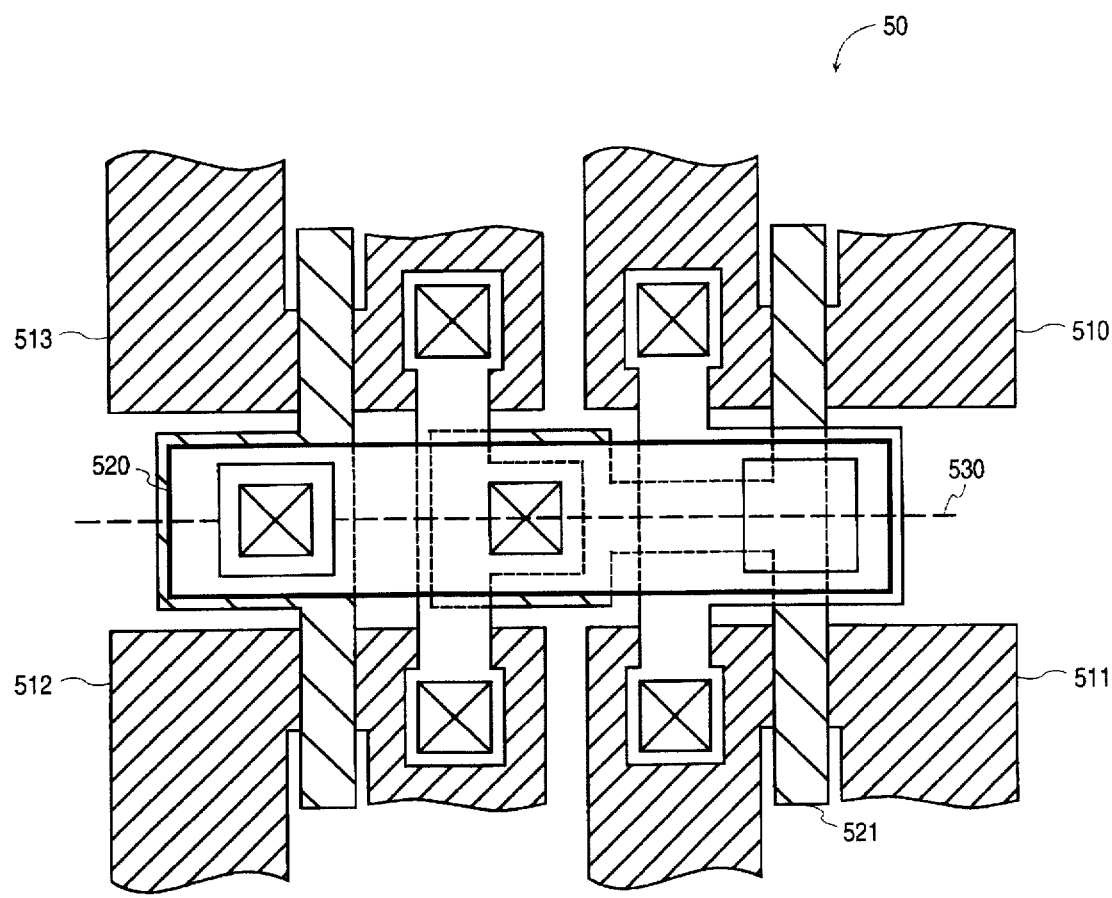
FIG. 5 illustrates a layout design of one embodiment of the present invention.

FIG. 5 illustrates a first embodiment of the present invention. The memory cell 50 comprises PMOS transistors 510 and 513, and NMOS transistors 511 and 512. Crossover 520 is implemented in a metal interconnect layer, and crossover 521 is implemented in a gate layer. This arrangement is better illustrated in the cross-sectional view of FIG. 6, taken at line 530 of memory cell 50.

Figure 6:
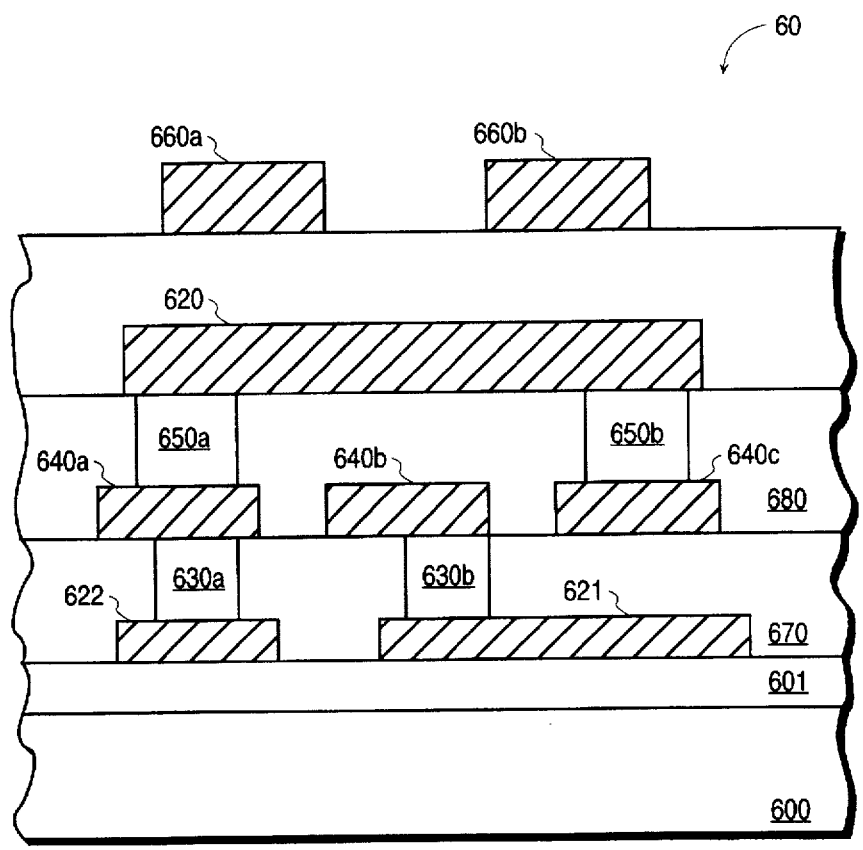
FIG. 6 illustrates a cross-section of the layout design of FIG. 5.

FIG. 6 illustrates the various layers of the memory cell 50. As is shown in FIG. 6, part of crossover 620 is disposed over crossover 621, i.e. they are "vertically stacked." This vertical stacking may be accomplished because crossover 620 is implemented in a second metal interconnect layer and crossover 621 is implemented in a gate layer. The methods of producing a memory cell 50 in accordance with the invention will be discussed in further detail below.

Note that the transistor devices 510–513 are not illustrated in FIG. 6. The methods of designing and fabricating metal-oxide-semiconductor (MOS) transistors are well-known in the art and thus will not be discussed in detail.

The first layer 600 of FIG. 6 comprises a semiconductor substrate. For an embodiment of the invention, the substrate comprises silicon (Si). Alternatively, the substrate may comprise other well-known suitable semiconductor materials such as gallium arsenide (GaAs).

On top of the devices 510–513 and the semiconductor substrate 600 is a field dielectric layer 601. In one embodiment, dielectric layer 601 comprises silicon dioxide ($SiO_2$) and is formed on the substrate 600 by one of several well-known chemical vapor deposition (CVD) processes. Alternatively, dielectric layer 601 is formed by thermal growth.

On top of the dielectric layer 601 is crossover 621 comprising a gate layer. Also shown in the gate layer is an interconnect 622 for coupling the gates of transistors 512 and 513. In one embodiment, crossover 621 comprises polysilicon, which may be doped or undoped. Alternatively, crossover 621 comprises another suitable material for use as a transistor gate contact. In another embodiment, crossover 621 further comprises a layer of titanium silicide ($TiSi_2$), or another metal or metal silicide exhibiting a low sheet resistance.

Crossover 621 is formed by first depositing the gate material (i.e. polysilicon) according to a polysilicon deposition technique, such as one of several well-known CVD techniques. Thereafter, a layer of photoresist, or another suitable mask material, is spun over the polysilicon. The photoresist is exposed and developed to define features such as crossover 621. The polysilicon is etched to create the desired features and the photoresist is removed.

A layer of dielectric 670 is formed on top of crossover 621. For one embodiment, dielectric layer 670 comprises borophosphosilicate glass (BPSG). Alternatively, dielectric layer 670 comprises a layer of phosphosilicate glass (PSG). Moreover, the dielectric layer 670 may comprise a diffusion barrier layer such as silicon nitride ($Si_3N_4$). For one embodiment, the dielectric layer 670 is formed by a CVD process. Alternatively, dielectric layer 670 is formed by thermal growth, sputtering, or by spin-on-glass deposition techniques.

A masking material (i.e. photoresist) is spun on the dielectric and patterned to define openings for contacts 630a and 630b. The dielectric is then etched according to a well-known etching technique, such as reactive ion etching (RIE).

Contacts 630a and 630b are then filled with a conductive material. For one embodiment, the conductive material comprises tungsten (W) deposited with a CVD process. The conductive material alternatively comprises another well-known contact material, such as aluminum. Moreover, the conductive material may be deposited by other deposition techniques such as sputtering or evaporation. The conductive material may further comprise one or more layers of titanium (Ti) or titanium nitride (TiN) for improving adhesion of the contact material and providing a diffusion barrier.

For one embodiment of the present invention, the substrate is now polished with a chemical-mechanical polishing system to planarize the tungsten and dielectric before the following steps are performed.

A first metal interconnect layer is then deposited on the substrate. The first metal interconnect layer comprises metal lines 640a, 640b, and 640c. Line 640a couples crossover 620 to the gate layer 622, which is the input of transistors 512 and 513. Line 640b couples the crossover 621 to the output of transistors 512 and 513. Metal line 640c couples the crossover 620 to the output of transistors 510 and 511. For one embodiment, the first metal interconnect layer comprises aluminum (Al). Alternatively, the metal interconnect layer comprises an alloy of aluminum and copper (Cu). For yet another alternative, the first metal layer comprises one or more layers of titanium (Ti) or titanium nitride (TiN). It should be appreciated that other conductive materials exhibiting desired properties (e.g., low resistivity, easy to form and etch, stability in mechanical stress and in processing) may be used for the first metal interconnect layer without departing from the scope of the present invention.

The first metal interconnect layer is formed by one of several well-known deposition techniques including, but not limited to, CVD, evaporation and sputtering. Thereafter, the metal lines 640a–c are defined by applying a layer of masking material (i.e. photoresist), patterning and developing it, and performing a metal etch according to well known metal etching techniques. For instance, a reactive-plasma or reactive-ion etching technique may be used. Following the etch, the photoresist is removed.

An interlevel dielectric (ILD) layer 680 is then formed on top of the first metal interconnect layer. For one embodiment, the ILD layer 680 comprises silicon dioxide (SiO$_2$) and is formed according to a CVD deposition technique. The dielectric layer 680 is then patterned and etched, as is described above, to form openings for vias 650a and 650b. For one embodiment, the ILD layer 680 is then planarized with a chemical-mechanical polishing method. Via 650a is used to couple the crossover 620 to the metal line 640a, thus coupling crossover 620 to the input of the inverter comprising transistors 512 and 513. Via 650b couples crossover 620 to metal line 640c, thus coupling crossover 620 to the output of the inverter comprising transistors 510 and 511.

Vias 650a and 650b are filled with a conductive material, such as tungsten (W). Alternatively, vias are additionally filled with one or more layers of titanium (Ti) or titanium nitride (TiN). It should be appreciated that other suitable conductive materials, such as aluminum (Al), could also be used to fill the vias 650a and 650b without departing from the scope of the present invention.

The conductive material is deposited using a well-known metal deposition technique, such as CVD, evaporation, or sputtering. For one embodiment, a chemical-mechanical polishing method is performed to planarize the conductive material before the following steps are performed.

The crossover 620 is then formed in the second level interconnect material. The second level interconnect material is formed similarly to the first level interconnect material. For one embodiment, the crossover 620 comprises aluminum (Al). Alternatively, the crossover 620 further comprises one or more layers of titanium (Ti) or titanium nitride (TiN). It should be appreciated that one of several well-known conductive materials can be used for the second metal interconnect layer without departing from the scope of the invention. For yet another embodiment, the second metal interconnect layer comprises a thicker layer of metal than the first metal interconnect layer in order to reduce the second metal layer's resistance.

A dielectric layer is formed on top of the second metal interconnect layer, according to the dielectric deposition methods described above. A third metal interconnect layer may optionally be deposited on top of the dielectric, as is illustrated by contacts 660a and 660b in FIG. 6.

Figure 7:
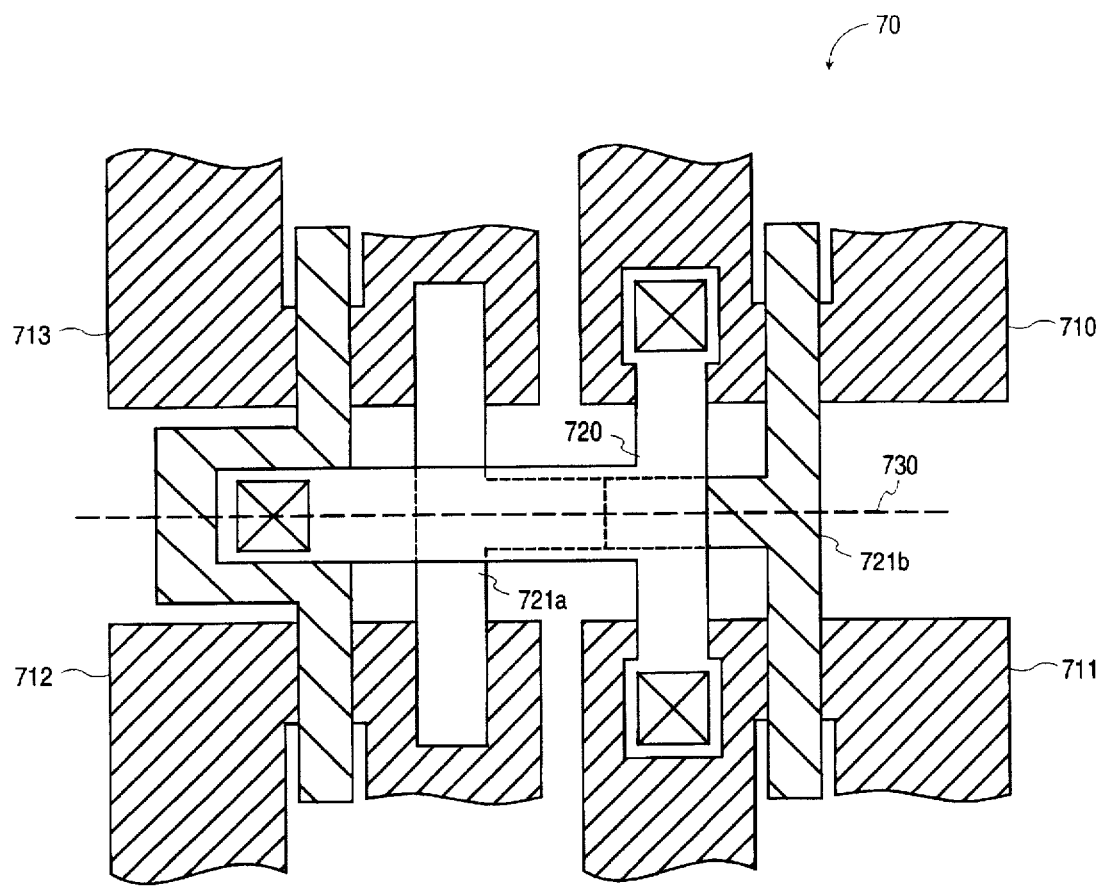
FIG. 7 illustrates a layout design of a second embodiment of the present invention.

FIG. 7 illustrates an alternate embodiment of the present invention. FIG. 7 is a layout design of a six transistor SRAM cell similar to cell 50 of FIG. 5. The memory cell 70 differs from memory cell 50 in that crossover 720 is implemented in a first metal interconnect layer and crossover 721 is implemented with two interconnects, the first interconnect comprising a gate layer and the second interconnect comprising a local interconnect layer. Interconnect 721a of crossover 721 couples the output of the inverter comprising transistors 712 and 713 to the interconnect 721b of crossover 721. Interconnect 721b of crossover 721 completes the connection to the input of the inverter comprising transistors 710 and 711.

Figure 8:
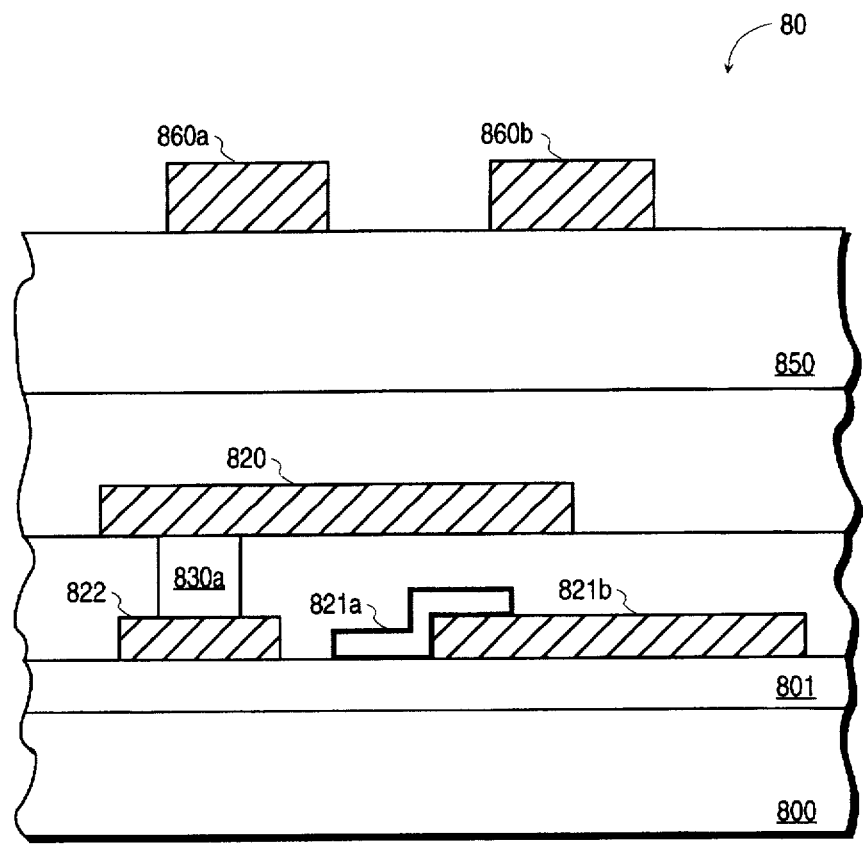
FIG. 8 illustrates a cross-section of the layout design of FIG. 7.

FIG. 8 illustrates a cross-section of the memory cell of FIG. 7, taken along line 730. The substrate 800 and dielectric layer 801 are similar to substrate 600 and dielectric layer 601, and thus are formed according to methods described in detail above with reference to FIG. 6.

Crossover 820 comprises a first metal interconnect layer. Crossover 821 comprises two interconnects 821a and 821b. Interconnect 821a comprises a local interconnect layer, as is described in further detail herein below. Interconnect 821b is formed of a gate layer, similar to crossover 621 of FIG. 6. Interconnect 821b is therefore implemented according to methods described above with reference to crossover 621 of FIG. 6.

Interconnect 821a is implemented in a local interconnect layer. The local interconnect layer is comprised of a conductive material that sits directly on top of the gate layer, such as interconnect 721b, and also on top of diffusion areas, such as the source and drain of transistors 713 and 712. For one embodiment, the local interconnect layer comprises titanium (Ti). Alternatively, the local interconnect layer comprises titanium nitride (TiN) or tungsten (W). The local interconnect layer may comprise one of many well-known conductive materials suitable for device interconnections. The local interconnect layer is formed by depositing the conductive material according to a known deposition method such as CVD, evaporation, or sputtering. The conductive material is then patterned (i.e. with a photoresist and etching step as described above) to create interconnect 821b.

Interconnect 822 is formed of gate material, and is used to couple the gates of transistors 713 and 714. For one embodiment, interconnect 822 comprises polysilicon and is formed according to methods described in conjunction with crossover 621 and interconnect 622 of FIG. 6.

A layer of dielectric material is deposited on top of crossovers 821a, 821b, and 822. Thereafter a contact 830a is formed to couple crossover 820 to the input of the inverter comprising transistors 712 and 713.

Crossover 820 comprises a first metal interconnect layer that is deposited and etched according to methods described above with reference to the first metal interconnect layer of FIG. 6. Crossover 820 couples the input of the inverter comprising transistors 713 and 712 to the output of the inverter comprising transistors 710 and 711.

Another layer of dielectric is deposited on top of the crossover 820, and thereafter a second level metal interconnect layer may be formed (not shown). Thereafter layers of dielectric and metal may be alternated as desired. As is shown in FIG. 8, two interconnects 860a and 860b, comprise a third layer of metal interconnect that may be used for coupling other circuitry (not shown).

In the foregoing detailed description a memory cell design with vertically stacked crossovers is described. The memory design of the present invention has been described with reference to specific materials, methods of fabrication, and layout design choices. It will be appreciated, however, that various changes and modifications may be made thereof without departing from the scope of the invention. For instance, one crossover may be implemented in a first metal interconnect layer and the other in a second metal interconnect layer. The particular fabrication process used in creating the memory cell will affect many of the design choices. The specification and drawings are, accordingly, to be regarded in an illustrative rather than a restrictive sense.

What is claimed is:

1. A semiconductor memory cell, comprising:

a first inverter having a first input and a first output;

a second inverter having a second input and a second output;

a first crossover connection formed in a first conductive layer, said first crossover connection directly connecting said first input to said second output; and a second crossover connection formed in a second conductive layer, said second crossover connection directly connecting said second input to said first output, said second crossover connection being formed on top of a portion of said first crossover connection, such that from a top view, the first and second crossovers overlap.

2. The semiconductor memory cell of claim 1, wherein said first inverter includes an n-type metal oxide semiconductor (NMOS) transistor and a p-type metal oxide semiconductor (PMOS) transistor.

3. The semiconductor memory cell of claim 1, wherein said second inverter includes an n-type metal oxide semiconductor (NMOS) transistor and a p-type metal oxide semiconductor (PMOS) transistor.

4. The semiconductor memory cell of claim 1, wherein said first crossover connection includes a first interconnect in a local interconnect layer and a second interconnect in a polysilicon layer.

5. The semiconductor memory cell of claim 1, wherein said second conductive layer is a metal layer deposited on a dielectric layer.

6. The semiconductor memory cell of claim 1, wherein said first conductive layer is a gate layer.

7. The semiconductor memory cell of claim 1, wherein said first conductive layer is a first metal layer, and said second conductive layer is a second metal layer, and wherein a dielectric layer is disposed between said first and second metal layers.

8. The semiconductor memory cell of claim 1, wherein said first crossover connection is formed of a material selected from the group consisting of polysilicon, titanium, titanium silicide, titanium nitride, and tungsten; and said second crossover connection is formed of a material selected from the group of aluminum, copper, titanium, and titanium nitride.

9. A semiconductor memory cell, comprising:

a first logic gate having a first input and a first output;

a second logic gate having a second input and a second output;

a first cross over connection directly connecting said first input to said second output, wherein said first cross over connection is formed in a first conductive layer of said semiconductor memory cell; and a second cross over connection directly connecting said second input to said first output, said second cross over connection being formed in a second conductive layer of said semiconductor memory cell, said second conductive layer being disposed on a dielectric layer formed on said first conductive layer, a majority of said second cross over connection vertically overlapping said first cross over connection.

10. The semiconductor memory cell of claim 9, wherein said first logic gate is a complementary metal oxide semiconductor (CMOS) inverter.

11. The semiconductor memory cell of claim 9, wherein said second logic gate is a complementary metal oxide semiconductor (CMOS) inverter.

12. The semiconductor memory cell of claim 9, wherein said first conductive layer is a gate layer.

13. The semiconductor memory cell of claim 9, wherein said first conductive layer includes a local interconnect feature and a gate interconnect feature.

14. The semiconductor memory cell of claim 9, wherein said second conductive layer is a metal layer.

15. The semiconductor memory cell of claim 9, wherein said first conductive layer is a first metal layer, and said second conductive layer is a second metal layer.

16. The semiconductor memory cell of claim 12, wherein said first conductive layer is polysilicon.

17. The semiconductor memory cell of claim 13, wherein said local interconnect feature is formed of a material selected from the group consisting of titanium, titanium nitride, and tungsten.

18. The semiconductor memory cell of claim 14, wherein said first and said second conductive layers are aluminum.

19. A semiconductor memory cell device-layer layout, comprising:

a first inverter device layout having a first input and a first output;

a second inverter device layout having a second input and a second output;

a first crossover connection layout for directly connecting said first input and said second output; and a second crossover connection layout for directly connecting said second input and said first output, a majority of said second crossover connection layout being disposed on top of said first crossover connection layout.

20. The device-layer layout of claim 19, wherein said first transistor device layout is a complementary metal oxide semiconductor (CMOS) inverter.

21. The device-layer layout of claim 19, wherein said second transistor device layout is a complementary metal oxide semiconductor (CMOS) inverter.

22. The device-layer layout of claim 19, wherein said first crossover connection layout is in a gate layer.

23. The device-layer layout of claim 19, wherein said first crossover connection layout includes a local interconnect layer and a gate layer.

24. The device-layer layout of claim 19, wherein said second crossover connection layout is in a metal layer.

25. The device-layer layout of claim 19, wherein said first crossover connection layout is in a first level metal layer and said second crossover connection layout is in a second level metal layer.

* * * * *